US 6,735,751 B2

(12) United States Patent
Furusawa

(10) Patent No.: US 6,735,751 B2
(45) Date of Patent: May 11, 2004

(54) FALSE PATH DETECTING APPARATUS AND A FALSE PATH DETECTING METHOD IN WHICH A USAGE AMOUNT OF MEMORIES IS SMALLER AND A PROCESS IS CARRIED OUT AT HIGHER SPEED, AND THAT PROGRAM

(75) Inventor: Shinya Furusawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 175 days.

(21) Appl. No.: 10/146,678

(22) Filed: May 15, 2002

(65) Prior Publication Data

US 2002/0174407 A1 Nov. 21, 2002

(30) Foreign Application Priority Data

May 16, 2001 (JP) ...................... 2001/146506

(51) Int. Cl.⁷ ............................................. G06F 17/50
(52) U.S. Cl. ........................................................ 716/6
(58) Field of Search ............................................. 716/6

(56) References Cited

U.S. PATENT DOCUMENTS 5,638,290 A * 6/1997 Ginetti et al. .................. 716/2
6,463,572 B1 * 10/2002 Pavisic et al. .................. 716/5

* cited by examiner

*Primary Examiner*—Satcy A. Whitmore
(74) *Attorney, Agent, or Firm*—Scully, Scott, Murphy & Presser

(57) ABSTRACT

A false path detecting method includes (a)~(e) steps. In the (a) step, a data flow occurrence condition that a net becomes active is provided. In the (b) step, one of said plurality of nets as a selected net is selected. In the (c) step, a net connected to an input side or an output side of an element connected to an input side or an output side of said selected net of said plurality of nets is selected as a first specific net. In the (d) step, said first specific net is added to said selected net to generate a first specific path. In the (e) step, whether or not said first specific path is a false path is judged based on said data flow occurrence condition of said selected net and said data flow occurrence condition of said first specific net.

23 Claims, 6 Drawing Sheets

Fig. 6A

| NET | IDENTIFIER OR THE LOGICAL EQUATION |
|---|---|
| R1 → F1 | ST1 |
| R2 → F1 | ST1 |
| F1 → F2 | ST1 |
| R3 → F2 | ST2 |
| R4 → F2 | ST1+ST2 |
| F2 → R9 | ST1 |
| F2 → F3 | ST2 |
| R5 → F3 | ST2*C1 |
| R6 → F3 | ST1+ST2*!C1 |
| R7 → F3 | ST1+ST2 |
| F3 → R10 | ST2 |
| F3 → F4 | ST1 |
| F8 → F4 | ST1 |
| F4 → R11 | ST1 |

Fig. 6B

PEOCESS ON "F3→ F4"

| GENERATED PATH | LOGICAL PRODUCT | JUDGEMENT RESULT |
|---|---|---|
| F2→F3→F4 | ST1*ST2=0 | FALSE PATH |
| R5→F3→F4 | ST1*ST2*C1=0 | FALSE PATH |
| R6→F3→F4 | ST1*(ST1+ST2*!C1)=ST1 | ACTIVE PATH |
| R7→F3→F4 | ST1*(ST1+ST2)=ST1 | ACTIVE PATH |

FALSE PATH DETECTING APPARATUS AND A FALSE PATH DETECTING METHOD IN WHICH A USAGE AMOUNT OF MEMORIES IS SMALLER AND A PROCESS IS CARRIED OUT AT HIGHER SPEED, AND THAT PROGRAM

FIELD OF THE INVENTION

1. Field of the Invention

The present invention relates to a false path detecting apparatus and a false path detecting method for detecting a false path implying a path that is not active in a combination of circuit operations, in circuits generated by behavioral synthesis, and a program for the same.

2. Description of the Related Art

Conventionally, as a technique used to design a large logical circuit, there is a behavioral synthesizing technique of automatically generating an RTL (Register Transfer Level) circuit, on the basis of a behavior description describing only a behavior, which does not contain a structure of hard-ware. Moreover, there is a logically synthesizing technique of converting this RTL circuit into a net list of a gate level. As for the circuit generated at this time, the circuit is generated under a predetermined delay constraint so that the delays of all paths (routes of data) are in a range of a predetermined period. At this time, in particular, in a circuit having a state transition and the like, there is a combination path of nets that do not become active at the same time throughout all the states. This path is a false path. The final false path is determined by the combination of paths that become active in each other states (hereafter, referred to as a true path).

If the logically synthesizing circuit satisfies only the delay constraint of the true path, the circuit is normally operated even if the delay of the false path is at the longest. So, the information with regard to the true path and the false path is reflected in the logical synthesis, and the delay constraint is not performed on the false path. At this time, as a method of extracting the information with regard to the true path and the false path from the circuit information after the behavioral synthesis, there is a method of checking the true path or the false path by referring to the information of the true path and comparing it, for the patterns of all the paths of the circuit. The false path detecting apparatus using the method will be described below with reference to the drawings.

FIG. 1 is a view showing a conventional false path detecting apparatus. A false path detecting apparatus 3 receives a circuit information outputted by a behavioral synthesizing system 1, a data flow information and a resource assignment information through a memory 4, and carries out a process as described below, and then outputs a false path information.

A true path lister 31 extracts all the true paths in the circuit from the circuit information, the data flow information and the resource assignment information, and stores them in a true path memory 34. For all partial circuits shared by an operating unit in partial circuits constituted by any combination in the true path memory 34, a false path candidate generator 32 extracts all paths existing in the partial circuit except the true path constituting the partial circuit, and outputs them to a false path minimizing device 33. The false path minimizing device 33 shortens the path from both the ends thereof while checking that the false path candidate is not the true path, for all the false path candidates. Then, it outputs the shortest false path, which does not contain a redundant path, to an output device 2.

As mentioned above, conventionally, the information with regard to all the true paths is stored, which results in a problem that a large number of memories are required in a case of a circuit information of a large integrated circuit. Also, in order to attain the minimization of the false path candidate, the comparison with the true path is repeated, which results in a problem that it takes a long time to complete the process. Also, it is sure that the size of an integrated circuit is further increased in future. Depending on a case, this results in a problem that it can not be applied to a further large circuit because of the lack of memories, the process time which can not be within a process time durable for practical use and other reasons.

SUMMARY OF THE INVENTION

The present invention is accomplished in view of the above mentioned problems. Therefore, an object of the present invention is to provide a false path detecting apparatus and a false path detecting method in which a usage amount of memories is smaller and a process is carried out at a higher speed, and that program.

In order to achieve an aspect of the present invention, a false path detecting method, includes: (a) providing a data flow occurrence condition that a net becomes active, with regard to each of a plurality of nets; (b) selecting one of the plurality of nets as a selected net; (c) selecting, as a first specific net, a net connected to an input side or an output side of an element connected to an input side or an output side of the selected net of the plurality of nets; (d) adding the first specific net to the selected net to generate a first specific path; and (e) judging whether or not the first specific path is a false path based on the data flow occurrence condition of the selected net and the data flow occurrence condition of the first specific net.

In this case, the false path detecting method further includes: (f) selecting, as a second specific net, a net connected to an input side or an output side of an element connected to an input side or an output side of the first specific path of the plurality of nets, when in the (e) the first specific path is not a false path; (g) adding the second specific net to the first specific path to generate a second specific path; and (h) judging whether or not the second specific path is a false path based on the data flow occurrence condition of the first specific path and the data flow occurrence condition of the second specific net.

Also in this case, a circuit including the false path can be designed without consideration of a delay time of the false path.

Further in this case, the data flow occurrence condition is represented as an identifier or an OR operation of identifiers.

In this case, whether or not the first specific path is the false path depends on a comparison of the identifier of the data flow occurrence condition of the selected net to the identifier of the data flow occurrence condition of the first specific net.

Also in this case, the first specific path is the false path when a result of an AND operation between the identifier of the data flow occurrence condition of the selected net and the identifier of the data flow occurrence condition of the first specific net corresponds to "0".

Further in this case, when the element connected to the input side or the output side of the selected net is an input terminal, an output terminal or a memory element, the (c), (d) and (e) are not performed.

In this case, the data flow occurrence condition is provided by an behavioral synthesis of automatically generating an RTL (Register Transfer Level) circuit based on a behavior description describing only a behavior, which does not contain a structure of hard-ware.

Also in this case, the false path detecting method is performed when the behavioral synthesis is performed.

Further in this case, the false path detecting method further includes: (i) judging whether or not the false path includes a redundant net; and (j) outputting the false path other than the false path including the redundant net.

In this case, the data flow occurrence condition is represented as an identifier or an OR operation of identifiers, and in the (i), when an AND operation with regard to the plurality of identifiers of the plurality of nets of the false path in order of an input side or an output side of the false path is performed until a result of the AND operation corresponds to "0" and the net on which the AND operation is not yet performed remains in case of the result corresponding to the "0", the false path is judged to include the redundant net of the remaining net.

In order to achieve another aspect of the present invention, a false path detecting apparatus, includes: an active condition extracting processor extracting a data flow occurrence condition that a net becomes active, with regard to each of a plurality of nets; a circuit information database storing the data flow occurrence conditions of the plurality of nets; a false path retrieving processor selects one of the plurality of nets as a selected net, and selects, as a first specific net, a net connected to an input side or an output side of an element connected to an input side or an output side of the selected net of the plurality of nets, and adds the first specific net to the selected net to generate a first specific path and judges whether or not the first specific path is a false path based on the data flow occurrence condition of the selected net and the data flow occurrence condition of the first specific net.

In this case, a circuit including the false path can be designed without consideration of a delay time of the false path.

Also in this case, the active condition extracting processor represents the data flow occurrence condition as an identifier or an OR operation of identifiers.

Further in this case, whether or not the first specific path is the false path depends on a comparison of the identifier of the data flow occurrence condition of the selected net to the identifier of the data flow occurrence condition of the first specific net.

In this case, the first specific path is the false path when a result of an AND operation between the identifier of the data flow occurrence condition of the selected net and the identifier of the data flow occurrence condition of the first specific net corresponds to "0".

Also in this case, when the element connected to the input side of the selected net is an input terminal, an output terminal or a memory element, the false path retrieving processor does not select the first specific net.

Further in this case, the active condition extracting processor extracts the data flow occurrence condition from a result of a behavioral synthesis of automatically generating an RTL (Register Transfer Level) circuit based on a behavior description describing only a behavior, which does not contain a structure of hard-ware.

In this case, the false path retrieving processor judges whether or not the first specific path is the false path when the behavioral synthesis is performed.

Also in this case, the false path detecting apparatus further includes: a redundant false path removing processor judging whether or not the false path includes a redundant net to output the false path other than the false path including the redundant net.

Further in this case, the data flow occurrence condition is represented as an identifier or an OR operation of identifiers, and when an AND operation with regard to the plurality of identifiers of the plurality of nets of the false path in order of an input side or an output side of the false path is performed until a result of the AND operation corresponds to "0" and the net on which the AND operation is not yet performed remains in case of the result corresponding to the "0", the redundant false path removing processor judges the false path to include the redundant net of the remaining net.

In order to achieve still another aspect of the present invention, a program for a process, includes: (aa) providing a data flow occurrence condition that a net becomes active, with regard to each of a plurality of nets; (ab) selecting one of the plurality of nets as a selected net; (ac) selecting, as a first specific net, a net connected to an input side or an output side of an element connected to an input side or an output side of the selected net of the plurality of nets; (ad) adding the first specific net to the selected net to generate a first specific path; and (ae) judging whether or not the first specific path is a false path based on the data flow occurrence condition of the selected net and the data flow occurrence condition of the first specific net.

In this case, a circuit including the false path can be designed without consideration of a delay time of the false path.

The present invention is proposed in order to solve the above-mentioned problems. The false path detecting apparatus according to the present invention is provided with: an active condition extractor for extracting the condition information that each of the nets in a circuit becomes active on the basis of a circuit information implying an information with regard to a circuit generated by an behavioral synthesis, a data flow information indicative of a flow of a data on the circuit, and an assignment information of a function element constituting the circuit; a circuit information with an active condition database, in which the condition information is stored while correlated to the circuit information for each net; and a false path retriever for retrieving a false path implying a path, which does not become active in a combination of circuit operations, for each net, by referring to the circuit information with the active condition database.

Thus, it is provided with: the active condition extractor for extracting the condition information that each of the nets in the circuit becomes active on the basis of the circuit information implying the information with regard to the circuit generated by the behavioral synthesis, the data flow information indicative of the flow of the data on the circuit, and the assignment information of the function element constituting the circuit; the circuit information with the active condition database, in which the condition information is stored while correlated to the circuit information for each net; and the false path retriever for retrieving the false path implying the path, which does not become active in the combination of the circuit operations, for each net, by referring to the circuit information with the active condition database.

Also, in the false path detecting apparatus according to the present invention, the false path retriever refers to the circuit information with the active condition database, for the path having one or a plurality of nets, and thereby carries out the logical product between the conditions that the plurality of nets become active. Thus, it is characterized to judge whether or not the path is active.

Thus, the false path retriever refers to the circuit information with the active condition database, for the path including one or a plurality of nets, and then carries out the logical product between the conditions that the plurality of nets become active, and then judges whether or not the path is active. Hence, it is possible to easily judge whether or not the path having the plurality of continuous nets is the active path.

Also, the false path detecting apparatus according to the present invention further includes: an active path memory for storing therein an active path information implying an information with regard to a path that is active or a net; and a net information memory for storing therein a net information with regard to a net targeted for a process for retrieving a false path. The false path retriever stores all the nets of the circuit in the active path memory, reads out any one of the active paths or the nets stored in the active path memory, and judges whether an element at an end on an input side of the read out net or active path is an input terminal or a memory element. Then, if the element is neither input terminal nor memory element, it determines the net connected to the input side of the element whose output is the net or the active path, on the basis of the circuit information, stores the net information in the net information memory, reads out any one of the nets stored in the net information memory, generates a new path composed of the read out net and the active path or net read out from the active path memory, refers to the circuit information with the active condition database, for all the nets in the new path, carries out the logical product with regard to the condition that it becomes active, and judges whether or not the new path is active. Then, if the new path is active, it stores the new path as the active path information in the active path memory, and if the new path is not active, it outputs the new path as the false path.

Thus, the false path retriever reads out any one of the active paths or the nets stored in the active path information memory, determines the net connected to the input side of the element whose output is the net or the active path, on the basis of the circuit information, stores the net information in the net information memory, reads out any one of the nets stored in the net information memory, generates the new path composed of the read out net and the active path or net read out from the active path memory, carries out the logical product with regard to the condition that it becomes active, for all the nets in the new path, and judges whether or not the new path is active. Then, if the new path is not active, the false path retriever outputs the new path as the false path. Hence, whether or not it is the false path can be checked by investigating the net retroactively to the input side.

Also, the false path detecting method according to the present invention includes: a first step of extracting the condition information that each of the nets of the circuit becomes active, on the basis of a circuit information implying an information with regard to a circuit generated by an behavioral synthesis, a data flow information indicative of a flow of a data on the circuit and an assignment information of a function element constituting the circuit; and a second step of referring to a circuit information with an active condition database, in which the condition information is stored while correlated to the circuit information for each net, and then retrieving a false path implying a path that does not become active in the combination of circuit operations, for each net.

Also, in the false path detecting method according to the present invention, the second step refers to the circuit information with the active condition database, for the path having one or a plurality of nets, and thereby carries out the logical product between conditions that the plurality of nets become active. Thus, it is characterized to judge whether or not the path is active.

Also, in the false path detecting method according to the present invention, at the second step, it stores all the nets of the circuit in the active path memory, reads out any one of the active paths or the nets stored in the active path memory, and judges whether an element at an end on an input side of the read out net or active path is an input terminal or a memory element. Then, if the element is neither input terminal nor memory element, it determines the net connected to the input side of the element whose output is the net or the active path, on the basis of the circuit information, stores the net information in the net information memory, reads out any one of the nets stored in the net information memory, generates a new path composed of the read out net and the active path or net read out from the active path memory, refers to the circuit information with the active condition database, for all the nets in the new path, carries out the logical product with regard to the condition that it becomes active, and judges whether or not the new path is active. Then, if the new path is active, it stores the new path as the active path information in the active path memory, and if the new path is not active, it outputs the new path as the false path.

Also, the program according to the present invention is the program for instructing a computer to execute a first step of extracting the condition information that each of the nets in the circuit becomes active on the basis of the circuit information implying the information with regard to the circuit generated by the behavioral synthesis, the data flow information indicative of the flow of the data on the circuit, and the assignment information of the function element constituting the circuit; and a second step of referring to the circuit information with the active condition database, in which the condition information is stored while correlated to the circuit information for each net, and then retrieving the false path implying the path, which does not become active in the combination of the circuit operations, for each net.

Also, the program according to the present invention is the program for instructing the computer to further execute the second step of referring to the circuit information with the active condition database, for the path having one or a plurality of nets, and carrying out the logical product between the conditions that the plurality of nets become active, and then judging whether or not the path is active.

Also, the program according to the present invention is the program for instructing the computer to further execute the second step of storing all the nets of the circuit in the active path memory, reading out any one of the active paths or the nets stored in the active path memory, judging whether an element at an end on an input side of the read out net or active path is an input terminal or a memory element, and determining the net connected to the input side of the element whose output is the net or the active path, on the basis of the circuit information, if the element is neither input terminal nor memory element, and then storing the net information in the net information memory, reading out any one of the nets stored in the net information memory, generating a new path composed of the read out net and the active path or net read out from the active path memory, referring to the circuit information with the active condition database, for all the nets in the new path, carrying out the logical product with regard to the condition that it becomes active, judging whether or not the new path is active, and storing the new path as the active path information in the active path memory if the new path is active, and outputting the new path as the false path if the new path is not active, and outputting the new path as the false path if the new path is not active.

BRIEF DESCRIPTION OF THE DRAWINGS

FIG. 6A is a view showing a data example processed by a false path detector 5 according to the embodiment of the present invention; and FIG. 6B is a view showing a data example processed by the false path detector 5 according to the embodiment of the present invention.

DESCRIPTION OF THE PREFERRED EMBODIMENT

The present invention will be described below through an embodiment of the present invention. However, the following embodiment does not limit the present invention noted in claims. Also, all combinations of features described in the embodiment are not always necessary to the solve devices in the present invention.

Figure 1:
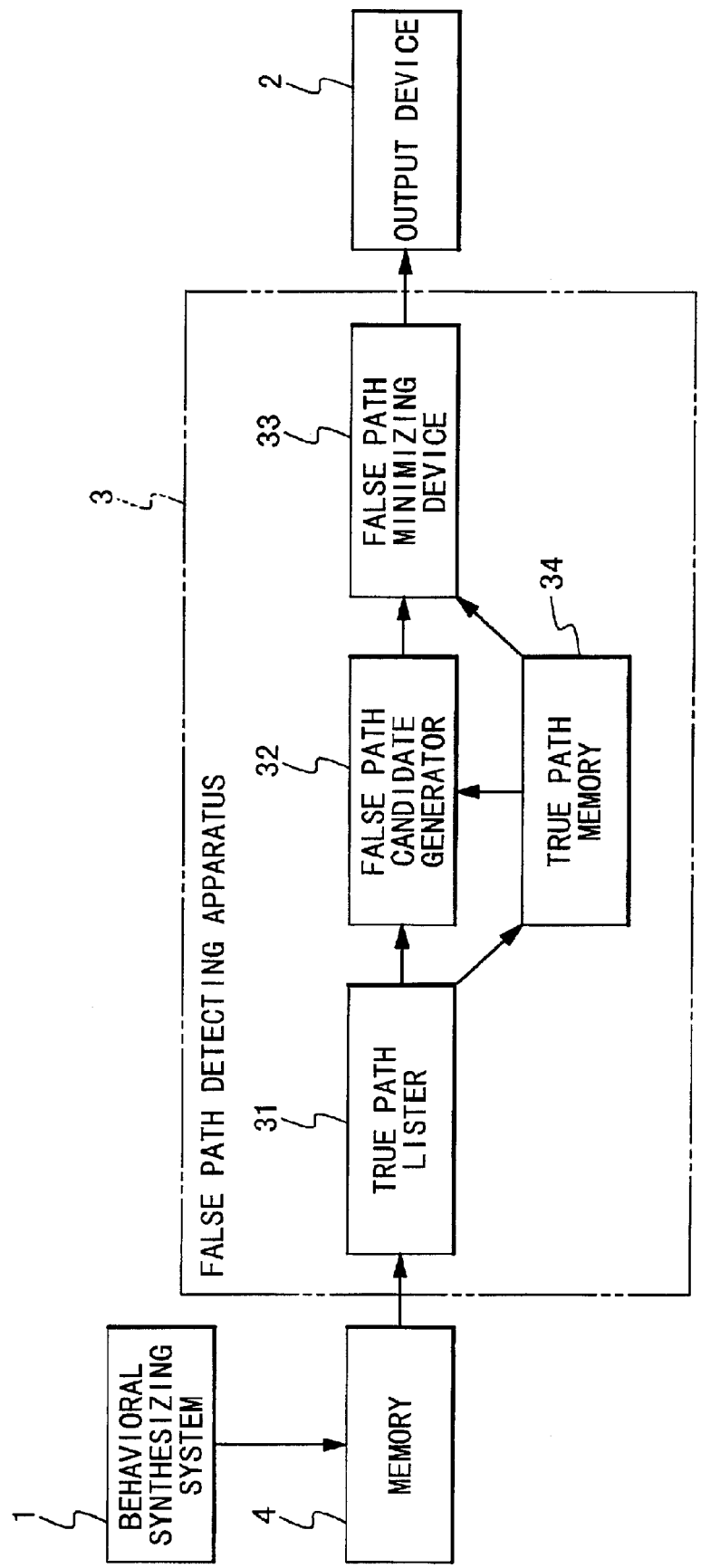
FIG. 1 is a view showing a conventional false path detector.
Figure 2:
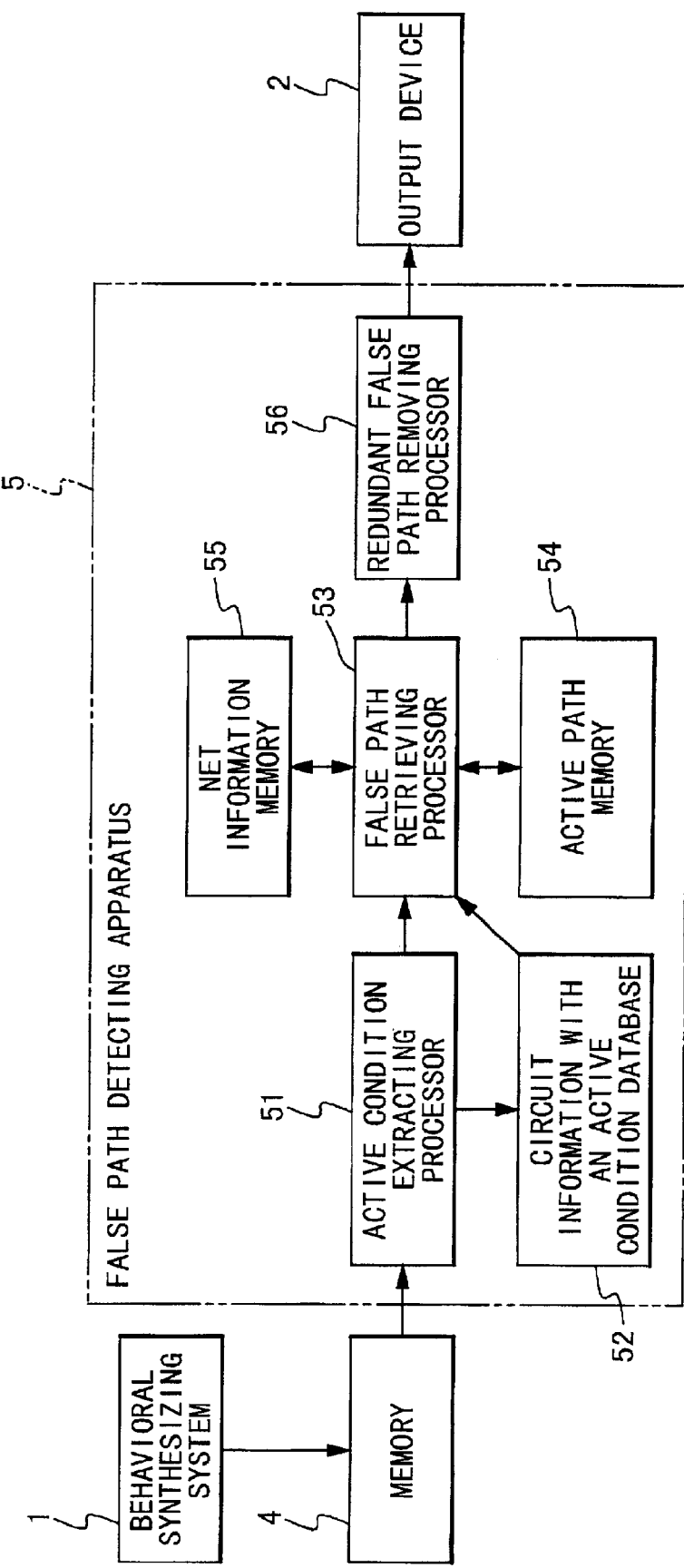
FIG. 2 is a block diagram showing an entire configuration of a system using a false path detecting apparatus according to an embodiment of the present invention.

FIG. 2 is a block diagram showing the entire configuration of a system using a false path detecting apparatus according to the embodiment of the present invention. In FIG. 2, the members shown by symbols 1, 2 and 4 have the same functions as the conventional apparatus shown in FIG. 1, respectively. A symbol 5 denotes a false path detecting apparatus for receiving a circuit information, a data flow information and a resource assignment information outputted by a behavioral synthesizing system 1 through a memory 4, and processing their information and then outputting a false path information.

The inner portion of the false path detecting apparatus 5 will be described below. A symbol 51 denotes an active condition extracting processor for extracting the condition information that each of nets of a circuit becomes active, on the basis of the circuit information implying the information with regard to the circuit, the data flow information indicative of a flow of a data on the circuit, and the resource assignment information of a function element constituting the circuit. A symbol 52 denotes a circuit information with an active condition database for storing the condition information extracted by the active condition extracting processor 51 in correlation to the circuit information for each net. A symbol 53 is a false path retrieving processor for referring to the circuit information with the active condition database 52, for a path including one or a plurality of nets, and carrying out the logical product between the conditions that the plurality of nets become active, and judging whether or not the path is active, and then performing a retrieving process on the false path, which does not become active, for each net. By the way, the detailed operation of the false path retrieving processor 53 will be described later.

A symbol 54 denotes an active path memory for storing therein an active path information implying an information with regard to a path which is active and processed by the false path retrieving processor 53. A symbol 55 is a net information memory for storing therein a net information with regarded to a net targeted for the processing, when performing the retrieving process on the false path. A symbol 56 is a redundant false path removing processor for outputting only the shortest false path by omitting the redundant path from the false paths outputted by the false path retrieving processor 53.

By the way, each of the above-mentioned processors may be attained by the dedicated hard-ware, and each processor may be composed of CPU (Central Processing Unit), and its function may be attained by loading a program for carrying out a function of each processor into a memory and then executing it.

Also, the above-mentioned memory is composed of a nonvolatile memory, such as a hard disc device, a magneto-optical disc device, a flash memory and the like, a readable recording medium such as CD-ROM and the like, a volatile memory, such as RAM (Random Access Memory) and the like, or a recording medium that is combined by them and can be read and written by a computer.

The operation of the false path detecting apparatus 5 will be described below with reference to FIGS. 3, 4. The operation of the false path detecting apparatus 5 can be divided into two processing operations of the active condition extracting processor 51 and the false path retrieving processor 53. At first, the processing operation of the active condition extracting processor 51 is described by using FIG. 3.

Figure 3:
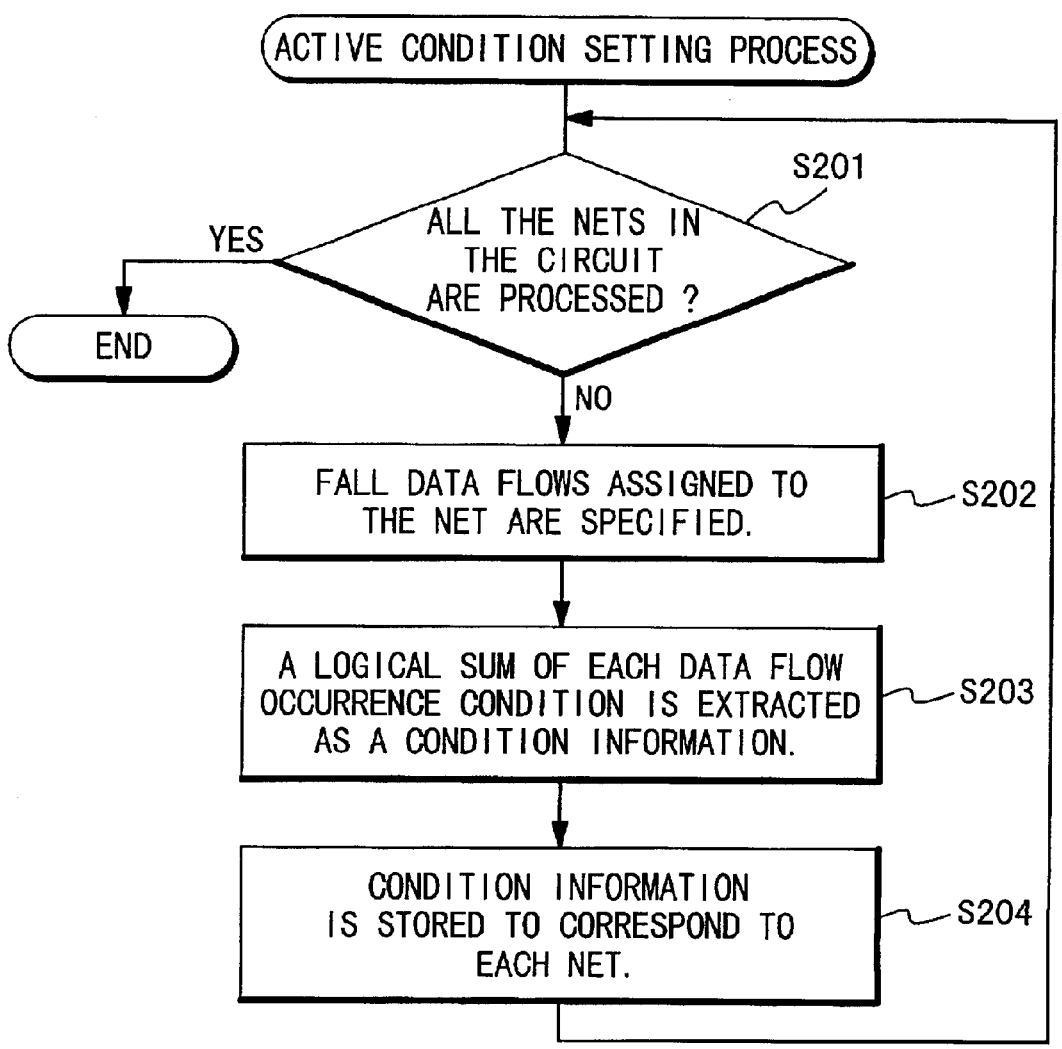
FIG. 3 is a flow chart showing a processing operation at an active condition extracting processor 51 according to the embodiment of the present invention.

FIG. 3 is a flow chart showing the processing operation at the active condition extracting processor 51 according to the embodiment of the present invention. The active condition extracting processor 51 performs the following processes on all the nets in the circuit, on the basis of the circuit information implying the information with regard to the circuit, which is generated by the behavioral synthesizing system 1 and received through the memory 4. At first, for one net, all data flows assigned to the net are specified on the basis of the received data flow information and assignment information (Step S202).

Next, each data flow occurrence condition assigned to the net is used as a predetermined identifier, and a logical sum (condition information) of the identifier is extracted (Step S203). As mentioned above, the active condition extracting processor 51 extracts the identifier of the data flow occurrence condition that each net becomes active, and its logical sum. That is, actually, if a certain circuit has a plurality of operation modes, the identifier for identifying the operation mode is added to the net in the circuit operated at each operation mode.

Next, the logical sum of the identifiers extracted by the active condition extracting processor 51 is stored in the circuit information with the active condition database 52 (Step S204). When the above-mentioned processes are ended for one net, the sequence returns back to the step S201, and the similar processes are performed on a next net. Then, when the above-mentioned processes are performed on all the nets in the circuit, the sequence is ended (Yes at Step S201). As mentioned above, as shown in FIG. 5, the circuit information to which the logical sum of the identifiers is added is stored in the circuit information with the active condition database 52.

Figure 5:
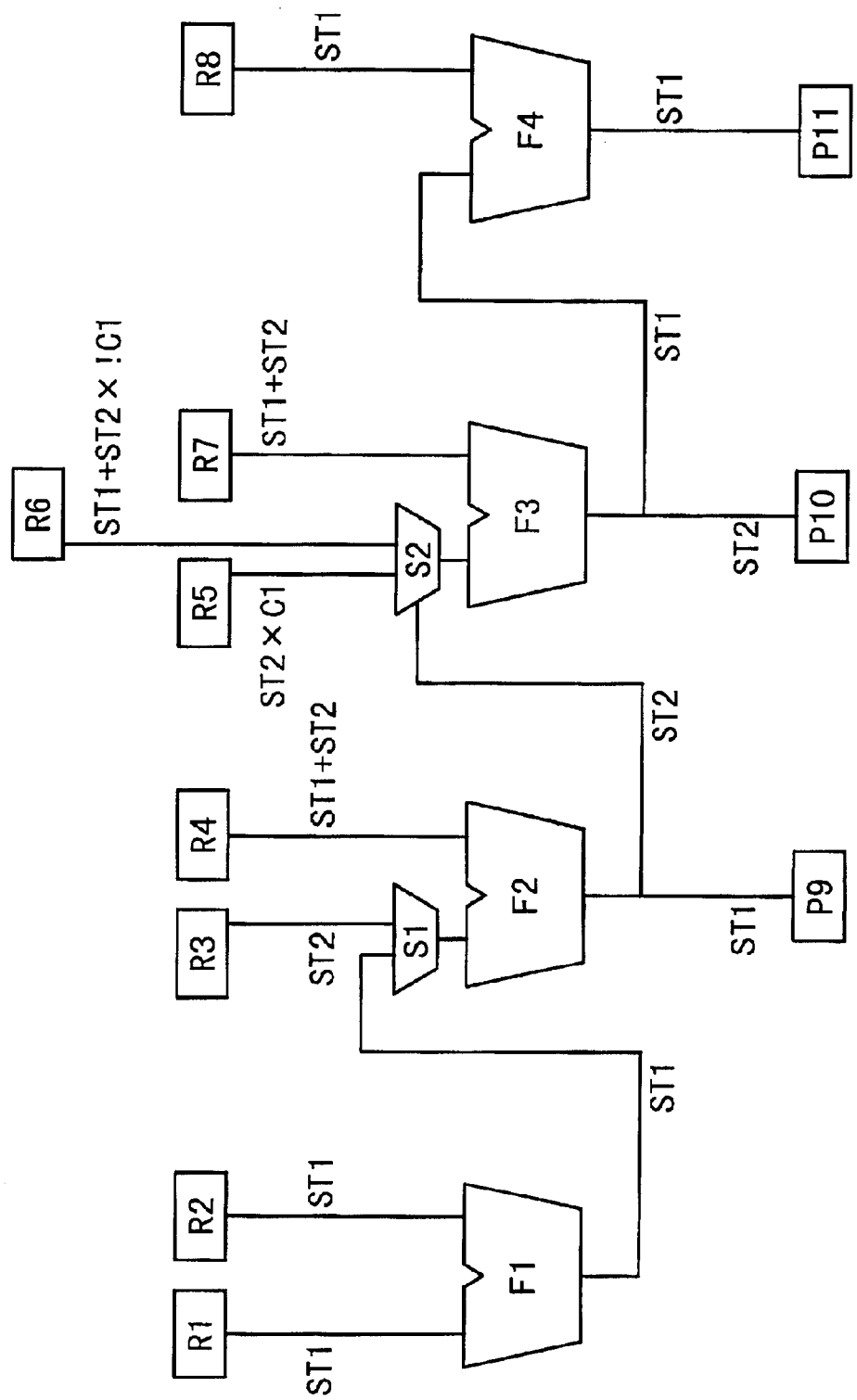
FIG. 5 is a block diagram showing a circuit to which an identifier or a logical equation of an identifier is added, according to the embodiment of the present invention.

By the way, in FIG. 5, symbols R1 to R8 denote input terminals, symbols R9 to R11 denote output terminals, symbols F1 to F4 denote operators and comparators, and symbols S1, S2 denote selectors. If the predetermined identifiers indicated by the data flow occurrence condition are assumed to be "ST1", "ST2" and "C1" and they are assigned to the respective nets and a plurality of identifiers are assigned, the logical sum and the logical product are carried out on the basis of the data flow occurrence condition, and the logical equation is assigned. Also, if the circuit information of FIG. 5 is used as the base, at least data shown in FIG. 6A is stored in the circuit information with the active condition database 52.

The processing operation at the false path retrieving processor 53 will be described below with reference to FIG. 4.

Figure 4:
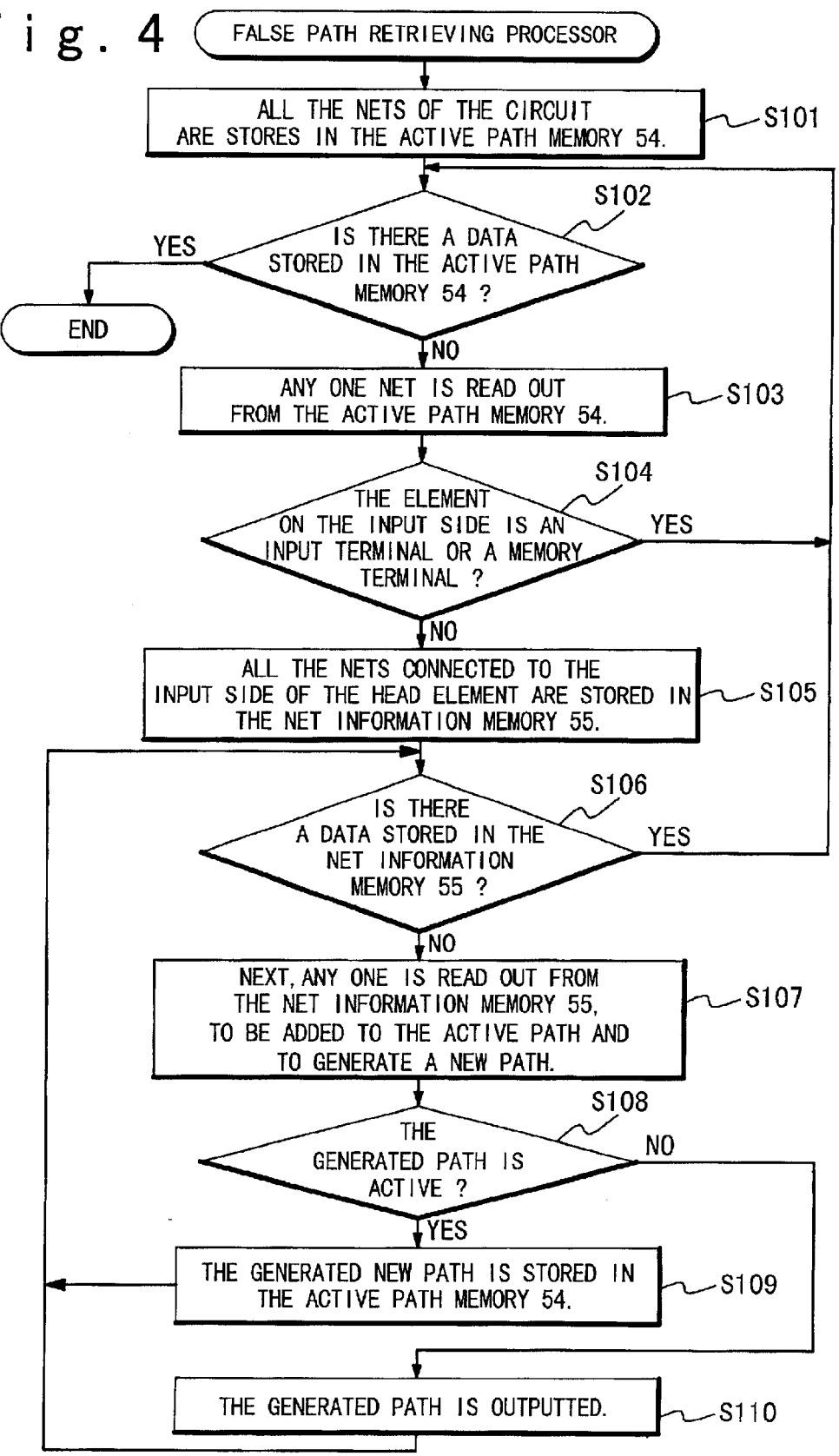
FIG. 4 is a flow chart showing a processing operation at a false path retrieving processor 53 according to the embodiment of the present invention.

FIG. 4 is a flow chart showing the processing operation at the false path retrieving processor 53 according to the embodiment of the present invention. The false path retrieving processor 53 reads out the information (the left row of FIG. 6A) with regard to all the nets of the circuit from the circuit information with the active condition database 52, and stores it in the active path memory 54 (Step S101). Next, the false path retrieving processor 53 checks whether or not there is a data stored in the active path memory 54 (Step S102). Since the sequence is at the state immediately after the information with regard to the net is stored at the steps S101, the sequence proceeds to "No" at the step S102. Next, the false path retrieving processor 53 reads out any one net from the active path memory 54 (here, let us suppose "F3→F4" underlined in FIG. 6A) (Step S103). By the way, the information with regard to the read out net is deleted from the active path memory 54.

Next, the false path retrieving processor 53 checks whether the element on the input side of the read out net "F3→F4" is an input terminal or a memory terminal (Step S104). Here, if the element on the input side of the net is the input terminal or the memory element (Yes at Step S104), the sequence returns back to the step S102. Here, since it is not (No at Step S104), the sequence proceeds to a next step. Next, the false path retrieving processor 53 reads out all the nets (F2→F3, R5→F3, R6→F3, R7→F3) connected to the input side of the element, in the element (F3) connected to the input side of the net, from the circuit information with the active condition database 52, and then stores them in the net information memory 55.

Next, the false path retrieving processor 53 checks whether or not there is a data stored in the net information memory 55 (Step S106). Here, the sequence is at the state immediately after the information with regard to the net is stored at the step S105. Thus, the sequence proceeds to a next step (No at Step S106). Next, the false path retrieving processor 53 reads any one (here, it is assumed to be F2→F3) from the net information memory 55, and adds the active path (here, the net F3→F4 used as the base), and then generates a new path "F2→F3→F4" (Step S107). By the way, when it is read out, "F2→F3" is deleted from the net information memory 55, and "R5→F3, R6→F3, R7→F3" is still stored in the net information memory 55.

Next, the false path retrieving processor 53 judges whether or not the generated path "F2→F3→F4" is active, by carrying out the logical product between the identifier "ST1" assigned to "F2→F3" and the identifier "ST2" assigned to "F3→F4" (Step S108). Here, ST1*ST2=0, and the path "F2→F3→F4" is judged to be the false path (No at Step S108). Thus, the false path retrieving processor 53 outputs the generated path to the redundant false path removing processor 56 (Step S110).

Next, the false path retrieving processor 53 instructs the sequence to return back to the step S106, and checks whether or not the data remains in the net information memory 55. Here, the processes when it is judged to be active at the step S108 are described as follows. Let us suppose that the false path retrieving processor 53 reads out "R6→F3" from the net information memory 55, and generates a new path "R6→F3→F4" (Step S107). Next, the false path retrieving processor 53 judges whether or not the generated path is active, by carrying out the logical product between the identifiers assigned to "F3→F4" and "R6→F3". Here, since ST1*(ST1+ST2*C1)=ST1, the path is judged to be active (Yes at Step S108). Thus, the false path retrieving processor 53 stores the generated new path "R6→F3→F4" in the active path memory 54 (Step S109). Next, the sequence returns back to the step S106.

After that, the processes from the step S106 to the step S110 are repeated until the net information memory 55 becomes empty (Yes at Step S106). As mentioned above, it is judged whether or not all the nets connected to the input side of F3 together with the net of "F3→F4" are the active paths. FIG. 6B shows the list of the judged results of the paths generated on the basis of "F3→F4". The path judged to be the false path is outputted to the redundant false path removing processor 56, and the path judged to be the active path is stored in the active path memory 54. Next, the sequence returns back to the step S102, and it is checked whether or not there is the data stored in the active path memory 54. After that, the false path retrieving processor 53 repeats the processes from the step S102 to the step S110 until in the active path memory 54, the information with regard to the net stored at the step S101 or the information with regard to the active path stored at the step S109 are all read out and deleted and it becomes empty.

As mentioned above, the path judged to be the false path in the circuit read out from the memory 4 is outputted from the false path retrieving processor 53, and inputted to the redundant false path removing processor 56. The redundant false path removing processor 56 judges whether or not the path judged to be the false path includes the redundant net, by using the following processes. At first, the redundant false path removing processor 56 calculates the logical product between the identifiers assigned to the nets, in the order starting from the input side of the false paths, and calculates them until the logical product becomes 0. Next, the redundant false path removing processor 56, if the net that is not calculated remains at the time when the logical product becomes 0, judges that the net is the false path including the redundant net, and deletes it. As mentioned above, it removes the false path including the redundant net, and outputs only the non-redundant false path to the output device 2.

By the way, the false path retrieving processor 53 judges whether the element at the end on the input side of the active path is an input terminal or a memory element. If the element is the input terminal or the memory element, it instructs the sequence to proceed to the process of another net or active path (Yes at Step S104). If the element is neither input terminal nor memory element, the false path retrieving processor 53 determines the net connected to the input side of the element whose active path is the output, on the basis of the circuit information, and stores the net information in the net information memory 55 (Step S105). Moreover, the false path retrieving processor 53 judges whether or not the net is stored in the net information memory 55 (Step S106).

If the net is stored (No at Step S106), the false path retrieving processor 53 reads out any one, and generates a new path composed of the read out net and the active path (Step S107).

Also, the respective processes may be carried out by recording the programs to embody the functions of the processors for carrying out the various processes in FIG. 2, on a recording medium that can be read in by a computer, and then recording the programs recorded in this recording medium in a computer system and executing them. By the way, the above-mentioned [Computer System] includes the hard-ware such as OS, a peripheral device and the like.

Also, [Recording Medium That Can Be Read in by Computer] implies a portable medium, such as a flexible disc, a magneto-optical disc, ROM, CD-ROM and the like, and a memory device such as a hard disc built in the computer system and the like. Moreover, [Recording Medium That Can Be Read in by Computer] includes a device that stores a program for a certain period, such as a volatile memory (RAM) inside a computer system serving as a client or a server when a program is transmitted through a network such as the Internet or the like or a communication line such as a telephone line or the like.

The above-mentioned program may be transmitted from the computer system, in which this program is stored in the memory or the like, through a transmission medium or a transmission wave in the transmission medium to another computer system. Here, [Transmission Medium] through which the program is transmitted implies the medium having the function of transmitting an information, such as the network (communication network) of the Internet or the communication line of the telephone line or the like.

Also, the program may be the program to embody a part of the above-mentioned functions. Moreover, it may be the program that can embody the functions by using the combination with the program already recorded in the computer system, namely, a so-called differential file (differential program).

As mentioned above, the embodiment of the present invention will be described below in detail with reference to the drawings. However, the actual configuration is not limited to this embodiment. It may include the design in the range that does not depart from the spirit and the scope of the present invention and the like.

As mentioned above, the false path detecting apparatus according to the present invention is provided with: the active condition extractor for extracting the condition information that each of the nets in the circuit becomes active on the basis of the circuit information implying the information with regard to the circuit generated by the behavioral synthesis, the data flow information indicative of the flow of the data on the circuit, and the assignment information of the function element constituting the circuit; the circuit information with the active condition database, in which the condition information is stored while correlated to the circuit information for each net; and the false path retriever for retrieving the false path implying the path, which does not become active in the combination of the circuit operations, for each net, by referring to the circuit information with the active condition database. Thus, the retrieving process can be performed on the false path for each net, on the basis of the condition information.

Consequently, as compared with the conventional method of comparing each of the paths in all the combinations in the circuit with the active path, the information required to be stored at the time of the processing is only the information of the path including the net. Thus, the effect of improving the processing speed of the computer can be obtained by reducing the amount of the information to be transiently stored at the time of the processing. Moreover, even if the conventional method requires the increase in the capacity of a cache memory for storing therein the transient information in order to process a large integrated circuit, the present invention does not require the above-mentioned increase. Hence, this provides the effect of reducing the facility cost.

Also, in the false path detecting apparatus according to the present invention, the false path retriever refers to the circuit information with the active condition database, for the path having one or a plurality of nets, and carries out the logical products between the conditions that the plurality of nets become active, and then judges whether or not the path is active. Thus, the judgment about the active path can be easily done in the paths having the plurality of continuous nets. Hence, as compared with the conventional method, it is not necessary to store all the active paths in the memory and then check the false path. Therefore, it is possible to attain the effects of the saving of the memory resource and the improvement of the processing speed.

What is claimed is:

1. A false path detecting method, comprising:
   (a) providing a data flow occurrence condition that a net becomes active, with regard to each of a plurality of nets;
   (b) selecting one of said plurality of nets as a selected net;
   (c) selecting, as a first specific net, a net connected to an input side or an output side of an element connected to an input side or an output side of said selected net of said plurality of nets;
   (d) adding said first specific net to said selected net to generate a first specific path; and
   (e) judging whether or not said first specific path is a false path based on said data flow occurrence condition of said selected net and said data flow occurrence condition of said first specific net.

2. The false path detecting method according to claim 1, further comprising:
   (f) selecting, as a second specific net, a net connected to an input side or an output side of an element connected to an input side or an output side of said first specific path of said plurality of nets, when in said (e) said first specific path is not a false path;
   (g) adding said second specific net to said first specific path to generate a second specific path; and
   (h) judging whether or not said second specific path is a false path based on said data flow occurrence condition of said first specific path and said data flow occurrence condition of said second specific net.

3. The false path detecting method according to claim 1, wherein a circuit including said false path can be designed without consideration of a delay time of said false path.

4. The false path detecting method according to claim 1, wherein said data flow occurrence condition is represented as an identifier or an OR operation of identifiers.

5. The false path detecting method according to claim 4, wherein whether or not said first specific path is said false path depends on a comparison of said identifier of said data flow occurrence condition of said selected net to said identifier of said data flow occurrence condition of said first specific net.

6. The false path detecting method according to claim 5, wherein said first specific path is said false path when a result of an AND operation between said identifier of said data flow occurrence condition of said selected net and said identifier of said data flow occurrence condition of said first specific net corresponds to "0".

7. The false path detecting method according to claim 1, wherein when said element connected to said input side or said output side of said selected net is an input terminal, an output terminal or a memory element, said (c), (d) and (e) are not performed.

8. The false path detecting method according to claim 1, wherein said data flow occurrence condition is provided by an behavioral synthesis of automatically generating an RTL (Register Transfer Level) circuit based on a behavior description describing only a behavior, which does not contain a structure of hard-ware.

9. The false path detecting method according to claim 8, wherein said false path detecting method is performed when said behavioral synthesis is performed.

10. The false path detecting method according to claim 1, further comprising:
   (i) judging whether or not said false path includes a redundant net; and
   (j) outputting said false path other than said false path including said redundant net.

11. The false path detecting method according to claim 10, wherein said data flow occurrence condition is represented as an identifier or an OR operation of identifiers, and in said (i), when an AND operation with regard to said plurality of identifiers of said plurality of nets of said false path in order of an input side or an output side of said false path is performed until a result of said AND operation corresponds to "0" and said net on which said AND operation is not yet performed remains in case of said result corresponding to said "0", said false path is judged to include said redundant net of said remaining net.

12. A false path detecting apparatus, comprising:
   an active condition extracting processor extracting a data flow occurrence condition that a net becomes active, with regard to each of a plurality of nets;
   a circuit information database storing said data flow occurrence conditions of said plurality of nets;
   a false path retrieving processor selects one of said plurality of nets as a selected net, and selects, as a first specific net, a net connected to an input side or an output side of an element connected to an input side or an output side of said selected net of said plurality of nets, and adds said first specific net to said selected net to generate a first specific path and judges whether or not said first specific path is a false path based on said data flow occurrence condition of said selected net and said data flow occurrence condition of said first specific net.

13. The false path detecting apparatus according to claim 12, wherein a circuit including said false path can be designed without consideration of a delay time of said false path.

14. The false path detecting apparatus according to claim 12, wherein said active condition extracting processor represents said data flow occurrence condition as an identifier or an OR operation of identifiers.

15. The false path detecting apparatus according to claim 14, wherein whether or not said first specific path is said false path depends on a comparison of said identifier of said data flow occurrence condition of said selected net to said identifier of said data flow occurrence condition of said first specific net.

16. The false path detecting apparatus according to claim 15, wherein said first specific path is said false path when a result of an AND operation between said identifier of said data flow occurrence condition of said selected net and said identifier of said data flow occurrence condition of said first specific net corresponds to "0".

17. The false path detecting apparatus according to claim 12, wherein when said element connected to said input side of said selected net is an input terminal, an output terminal or a memory element, said false path retrieving processor does not select said first specific net.

18. The false path detecting apparatus according to claim 12, wherein said active condition extracting processor extracts said data flow occurrence condition from a result of a behavioral synthesis of automatically generating an RTL (Register Transfer Level) circuit based on a behavior description describing only a behavior, which does not contain a structure of hard-ware.

19. The false path detecting apparatus according to claim 18, wherein said false path retrieving processor judges whether or not said first specific path is said false path when said behavioral synthesis is performed.

20. The false path detecting apparatus according to claim 12, further comprising:
   a redundant false path removing processor judging whether or not said false path includes a redundant net to output said false path other than said false path including said redundant net.

21. The false path detecting method according to claim 20, wherein said data flow occurrence condition is represented as an identifier or an OR operation of identifiers, and when an AND operation with regard to said plurality of identifiers of said plurality of nets of said false path in order of an input side or an output side of said false path is performed until a result of said AND operation corresponds to "0" and said net on which said AND operation is not yet performed remains in case of said result corresponding to said "0", said redundant false path removing processor judges said false path to include said redundant net of said remaining net.

22. A program for a process, comprising:
   (aa) providing a data flow occurrence condition that a net becomes active, with regard to each of a plurality of nets;
   (ab) selecting one of said plurality of nets as a selected net;
   (ac) selecting, as a first specific net, a net connected to an input side or an output side of an element connected to an input side or an output side of said selected net of said plurality of nets;
   (ad) adding said first specific net to said selected net to generate a first specific path; and
   (ae) judging whether or not said first specific path is a false path based on said data flow occurrence condition of said selected net and said data flow occurrence condition of said first specific net.

23. The program for a process according to claim 22, wherein a circuit including said false path can be designed without consideration of a delay time of said false path.

* * * * *